(12) United States Patent
Peng et al.

(10) Patent No.: US 7,319,588 B2
(45) Date of Patent: Jan. 15, 2008

(54) HEAT DISSIPATION DEVICE

(75) Inventors: Xue-Wen Peng, Guangdong (CN); Bing Chen, Guangdong (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 180 days.

(21) Appl. No.: 11/307,153

(22) Filed: Jan. 25, 2006

(65) Prior Publication Data

US 2007/0171616 A1    Jul. 26, 2007

(51) Int. Cl.
*H05K 7/20* (2006.01)

(52) U.S. Cl. ............... 361/700; 361/704; 361/719; 174/15.2; 165/80.4; 165/104.21; 257/715

(58) Field of Classification Search .............. None
See application file for complete search history.

(56) References Cited

U.S. PATENT DOCUMENTS

| | | | |
|---|---|---|---|
| 5,930,115 A | * | 7/1999 | Tracy et al. ............. 361/704 |
| 5,960,865 A | | 10/1999 | Costa et al. |
| 6,839,235 B2 | * | 1/2005 | St. Louis et al. ........... 361/700 |
| 6,937,474 B2 | | 8/2005 | Lee |
| 7,019,974 B2 | * | 3/2006 | Lee et al. ................. 361/700 |
| 7,177,152 B1 | * | 2/2007 | Sun ......................... 361/697 |
| 7,209,356 B2 | * | 4/2007 | Lee et al. ................. 361/719 |

\* cited by examiner

*Primary Examiner*—Boris Chervinsky
(74) *Attorney, Agent, or Firm*—Winston Hsu (57) ABSTRACT

A heat dissipation assembly includes a printed circuit board, first and second heat dissipation units each defining a channel therein and a heat pipe. The printed circuit board has an electronic heat-generating component mounted thereon. The first heat dissipation unit is attached to a top surface of the heat-generating component. The second heat dissipation unit has a main portion disposed beneath the printed circuit board and another portion extending from a level beneath the printed circuit board to another level above the printed circuit board. The heat pipe is wholly disposed above the printed circuit board and comprises an evaporating portion rotatably received in the channel of the first heat dissipation unit and a condensing portion rotatably received in the channel of the second heat dissipation unit.

20 Claims, 8 Drawing Sheets

HEAT DISSIPATION DEVICE

CROSS-REFERENCES TO RELATED APPLICATION

This application is related to a co-pending patent application Ser. No. 11/166,311, entitled "HEAT DISSIPATION DEVICE" and filed on Jun. 24, 2005, which is assigned to the same assignee as this application and is hereby incorporated by reference.

FIELD OF THE INVENTION

The present invention relates generally to a heat dissipation device, and more particularly to a heat dissipation device for removing heat from an electronic heat-generating component mounted on a printed circuit board.

DESCRIPTION OF RELATED ART

Heat sinks having heat pipes engaged therewith are commonly used as thermal management resolution of electronic heat-generating components such as central processing units (CPUs), chipsets etc. which frequently generate large amounts of heat during normal operation.

A typical heat sink is formed by aluminum extrusion and comprises a base for receiving heat from a heat-generating component and a plurality of fins extending from the base to dissipate the heat to ambient air. A heat pipe generally comprises an evaporating portion engaged with the base and a condensing portion engaged with the fins, to transfer heat from the base to the fins remote from the base. In a combination of the heat sink and heat pipe, the heat pipe plays a role of transferring heat from one part of the heat sink to another part of the heat sink. The heat is still accumulated on the heat sink. To improve heat dissipating capability of the heat sink, the heat sink is manufactured to have a more and more bulk volume with a great height. This is incompatible with the current trend of electronic devices to have a compact structure.

As an improved thermal management resolution, a heat dissipation device is proposed, having a same volume as the above-mentioned heat sink and comprising a first heat sink, a second heat sink separate from the first heat sink and a heat pipe. In the heat dissipation device, the first heat sink is intimately attached on the heat-generating component for absorbing the heat generated by the heat-generating component and the second heat sink is not directly thermally engaged with the heat-generating component but is connected to the first heat sink via the heat pipe. The first and second heat sinks are used for cooperatively dissipating the heat generated by the heat-generating component. The heat dissipation device is suitable to be applied to a situation that a space (particularly a height of the space) around the heat-generating component is limited, because the second heat sink may be positioned to a location away from the first heat sink and the heat-generating component.

However, the heat pipe is a vacuum-sealed metallic pipe that is filled with a phase changeable fluid; thus, the heat pipe is certainly rigid. Additionally, the heat pipe is securely engaged with the first and second heat sink before the heat dissipation device is mounted to the heat-generating component; thus, a structure and geometry of the heat dissipation device have been fixed before the heat dissipation device is employed to be mounted to the heat-generating component. As a result, it is sometimes difficult or even at the risk of damaging the heat dissipation device or related components such as the heat-generating component when assembling the heat dissipation device to the heat-generating component if the positional or dimensional tolerance of the heat dissipation device is not precisely fallen within the required norms.

What is needed is a heat dissipation assembly which facilitates an attachment of the heat dissipation device to an electronic heat-generating device mounted on a printed circuit board while has a better heat dissipation capability.

SUMMARY OF INVENTION

A heat dissipation assembly in accordance with a preferred embodiment of the present invention comprises a printed circuit board, first and second heat dissipation units each defining a channel therein and a heat pipe. The printed circuit board has an electronic heat-generating component mounted thereon. The first heat dissipation unit is attached to a top surface of the heat-generating component. The second heat dissipation unit has a main portion disposed beneath the printed circuit board and another portion extending from a level beneath the printed circuit board to another level above the printed circuit board. The heat pipe is wholly disposed above the printed circuit board and comprises an evaporating portion rotatably received in the channel of the first heat dissipation unit and a condensing portion rotatably received in the channel of the second heat dissipation unit.

Other advantages and novel features will become more apparent from the following detailed description of preferred embodiments when taken in conjunction with the accompanying drawings, in which:

DETAILED DESCRIPTION

Referring to FIGS. 1-4, a heat dissipation assembly in accordance with a preferred embodiment of the invention comprises a first heat dissipation unit 10, a second heat dissipation unit 20 and a heat pipe 30 connecting the first and second heat dissipation units 10. 20. The first and second heat dissipation heat dissipation units 10, 20 are connected by the heat pipe 30 and is used to remove heat from an electronic heat-generating component 40 mounted on a top of a printed circuit board 50. The printed circuit board 50 defines a pair of spaced orifices 59 therein adjacent to the heat-generating component 40.

Figure 1:
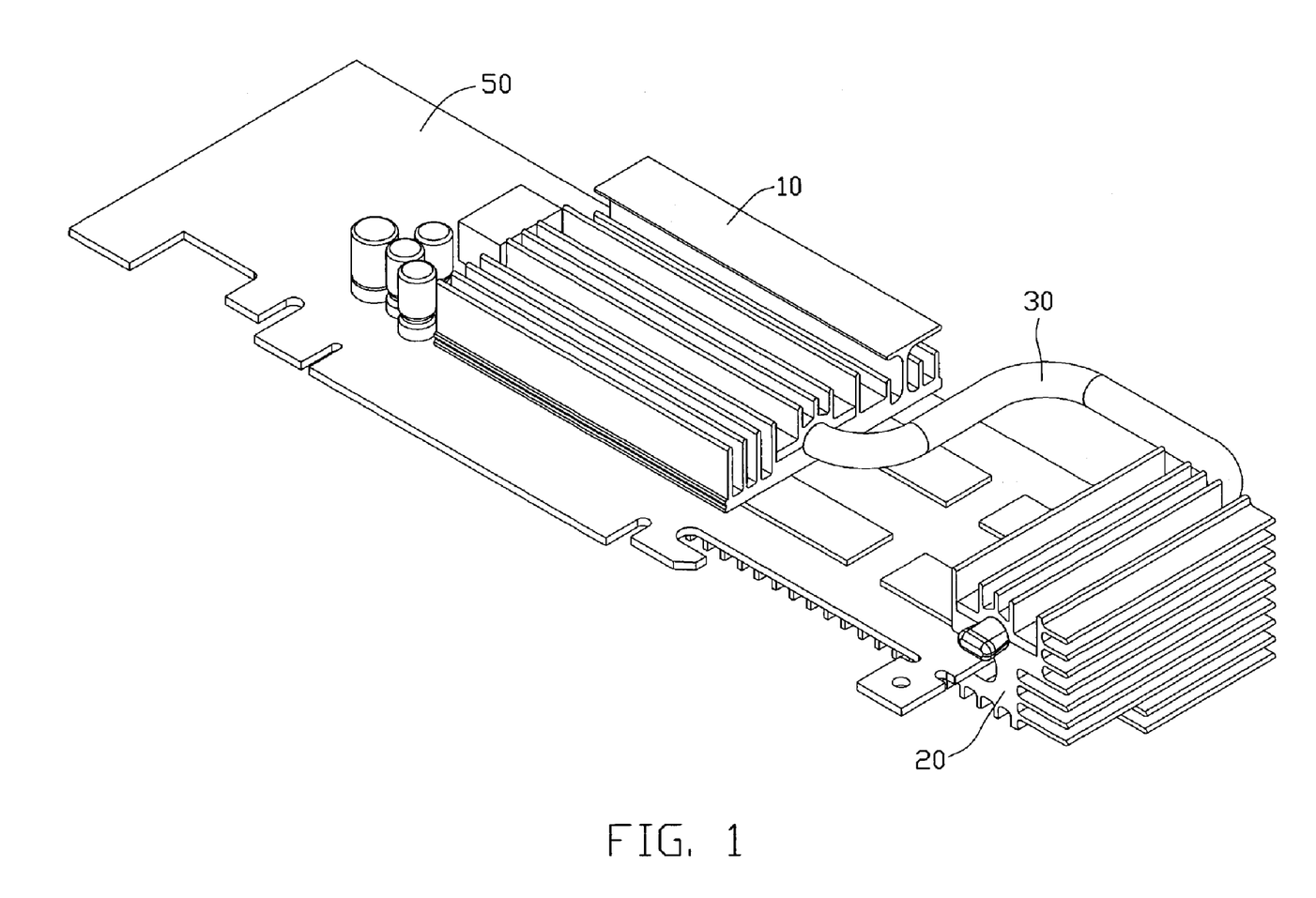
FIG. 1 is an isometric view of a heat dissipation assembly in accordance with a preferred embodiment of the present invention.
Figure 2:
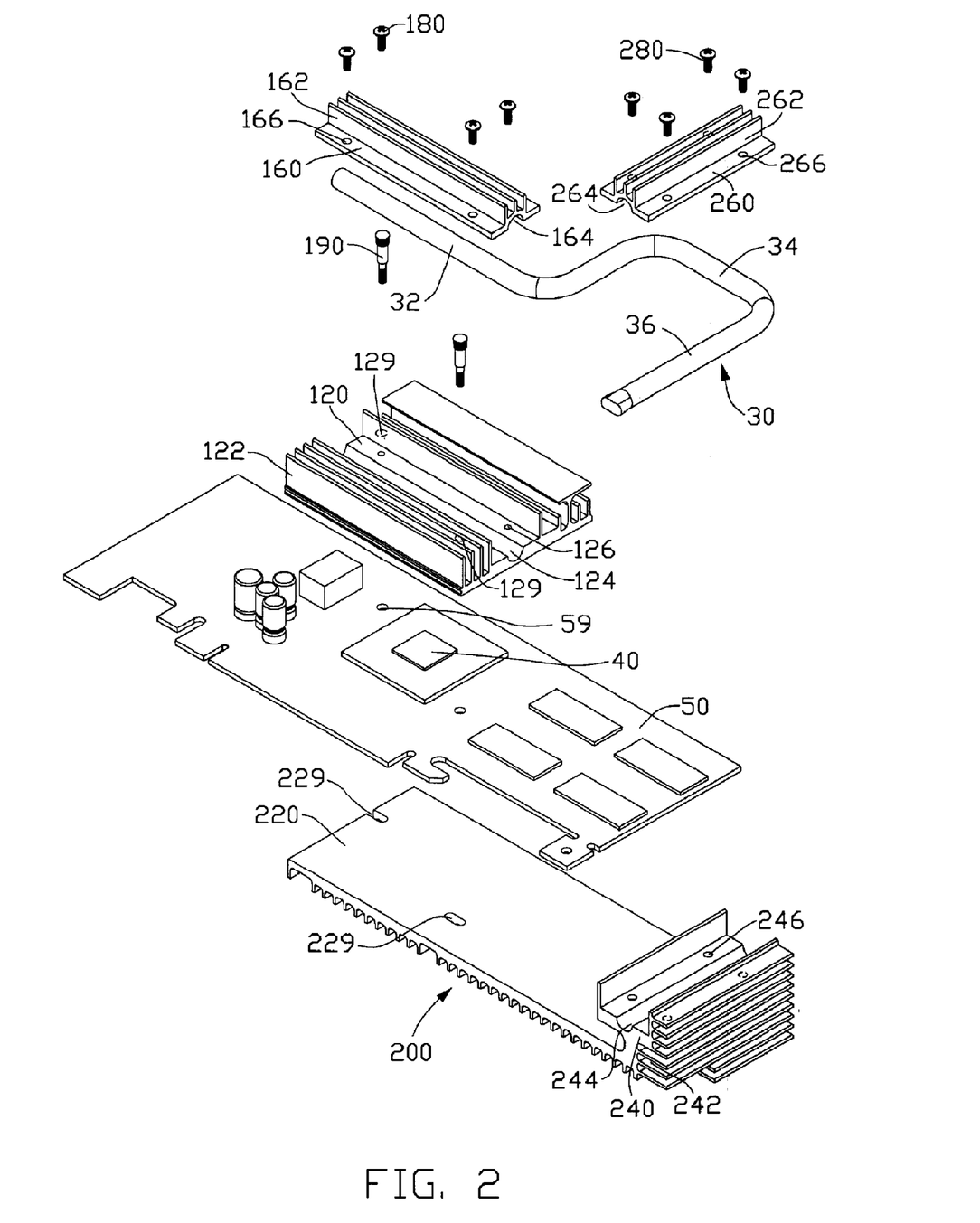
FIG. 2 is an exploded, isometric view of FIG. 1.
Figure 3:
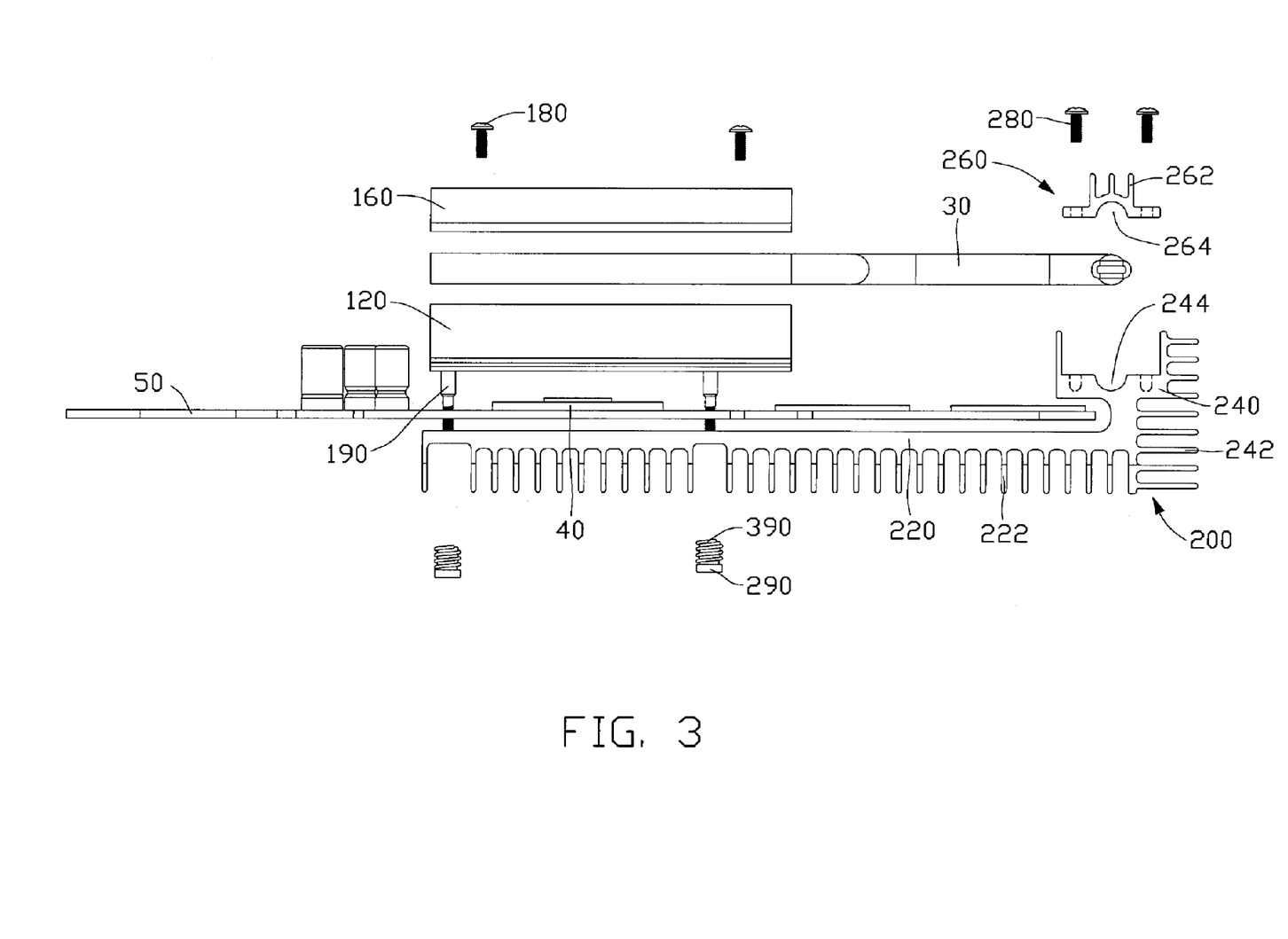
FIG. 3 is an exploded, elevation side view of FIG. 1.

Particularly referring to FIGS. 2-3, the heat pipe 30 comprises an evaporating portion 32 and a condensing portion 36.

The first heat dissipation unit 10 comprises a base member 120 for attaching on a top surface of the heat-generating component 40, a clamping member 160 engaging with the base member 120 and securing members such as screws 180 which are used to position the clamping member 160 onto the base member 120. The base member 120 is formed by aluminum extrusion to simultaneously have a plurality of fins 122 integrally formed at a top side of the base member 120 and a semicircular groove 124 at the top side of the base member 120 and parallel to the fins 122. Four screw holes 126 are defined in the base member 120, and two of the screw holes 126 are separately disposed at a rear side of the groove 124 and the other two of the screw holes 126 are separately disposed at a front side of the groove 124. Two bores 129 are defined in the base member 120 aligned with the orifices 59 defined in the printed circuit board 50.

The clamping member 160 is formed by aluminum extrusion to simultaneously have a plurality of fins 162 integrally formed at a top side of the clamping member 160 and a semicircular groove 164 at a bottom side of the clamping member 160 and parallel to the fins 162. Four through holes 166 are defined in the clamping member 160 aligned with the screw holes 126. The screws 180 are used to extend through the through holes 166 of the clamping member 160 and threadingly engage in the screw holes 126 of the base member 120 to have the clamping member 160 positioned onto the base member 120. The semicircular grooves 124, 164 commonly define a circular channel (not labeled) for receiving the evaporating portion 32 of the heat pipe 30, when the clamping member 160 is positioned onto the base member 120.

Figure 4:
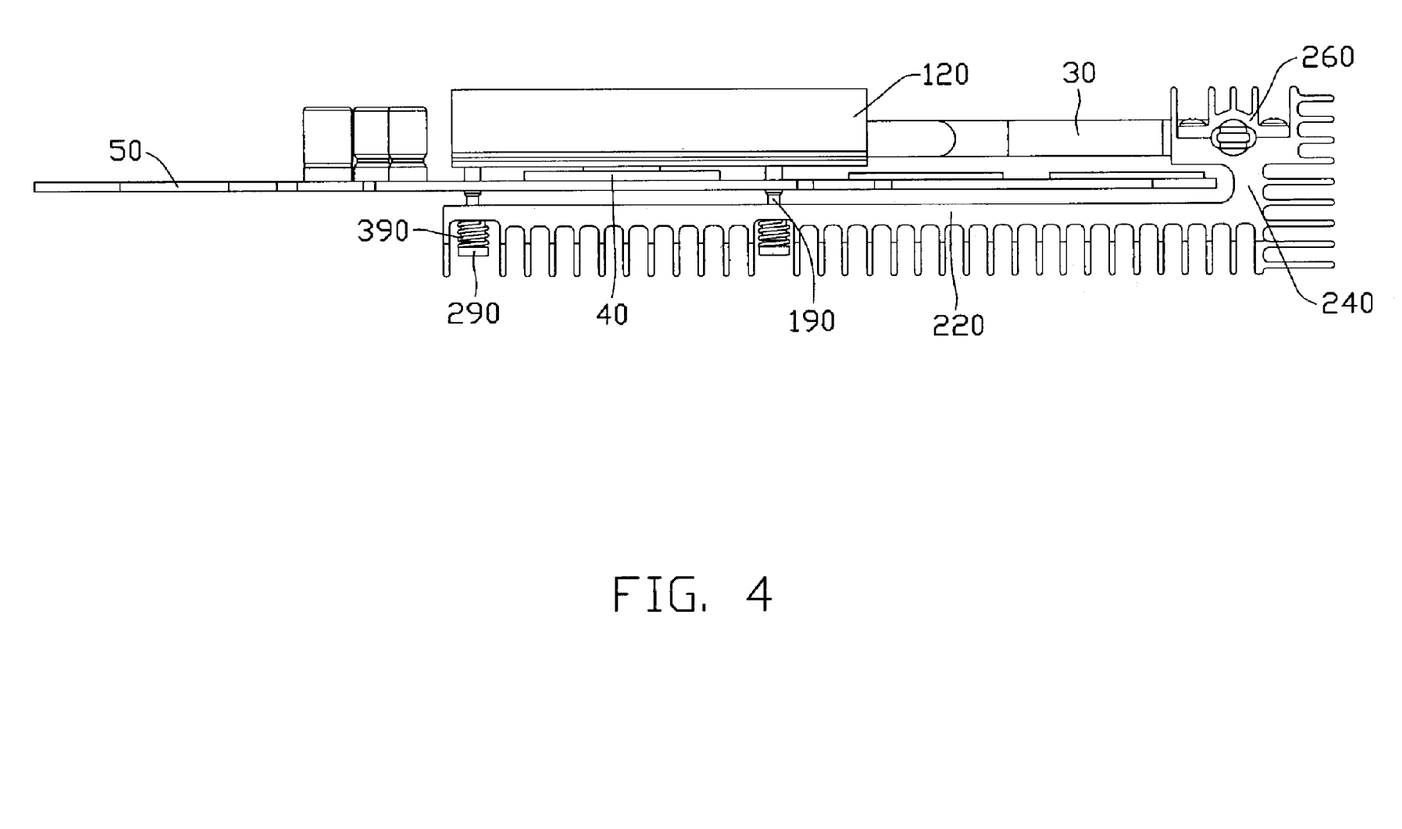
FIG. 4 is similar to FIG. 3, but is an assembled view.

The second heat dissipation unit 20 comprises a base member 200, a clamping member 260 and securing members such as screws 280 which may position the clamping member 260 onto the base member 200. The base member 200 is formed by extrusion and comprises a substrate portion 220 beneath the printed circuit board 50 and a support portion 240 integrally extended from a right end of the substrate portion 220 so that the base member 200 has a substantially L-shaped profile seen from an elevation side as shown in FIGS. 3-4. A plurality of fins 222 perpendicularly extends downwardly from a bottom side of the substrate portion 220. Two elongated notches 229 are defined in the substrate portion 220 and in alignment with the orifices 59 defined in the printed circuit board 50, wherein one of the notches 229 extend to an extremity of a left edge of the substrate portion 220. The support portion 240 extends from the substrate portion 220 toward the first heat dissipation unit 10. The support portion 140 comprises a plurality of fins 242 at a longitudinal outer side and a top side thereof respectively. A semicircular groove 244 is defined in the top side of the support portion 140. Four screw holes 246 are defined in the support portion 240, and two of the screw holes 246 are separately disposed at a right side of the groove 244 and the other two of the screw holes 246 are separately disposed at a left side of the groove 244.

The clamping member 260 is formed by aluminum extrusion to simultaneously have a plurality of fins 262 integrally formed at a top side of the clamping member 260 and a semicircular groove 264 at a bottom side of the clamping member 260 and parallel to the fins 262. Four through holes 266 are defined in the clamping member 260 aligned with the screw holes 246. The screws 280 are used to extend through the through holes 266 of the clamping member 260 and threadingly engage in the screw holes 246 of the support portion 240 to have the clamping member 260 positioned onto the support portion 240. The semicircular grooves 244, 264 commonly define a circular channel (not labeled) for receiving the condensing portion 36 of the heat pipe 30, when the clamping member 260 is positioned onto the support portion 240.

Before the heat dissipation units 10, 20 and the heat pipe 30 are employed to be mounted to the printed circuit board 50, the screws 180 extend through the through holes 166 of the clamping member 160 and partly threadingly engage in the screw holes 126 defined in the base member 120 so that the clamping member 160 is loosely positioned onto the base member 120 and the semicircular grooves 124, 164 commonly define the circular channel for loosely receiving the evaporating portion 32 of the heat pipe 30 therein. The evaporating portion 32 of the heat pipe 30 is rotatable in the channel between the clamping member 160 and the base member 120; that is, a combination of the base member 120 and the clamping member 160 via the screws 180 can pivot on the evaporating portion 32 of the heat pipe 30. Similarly, the screws 280 extend through the through holes 266 of the clamping member 260 and partly threadingly engage in the screw holes 246 of the support portion 240 so that the clamping member 260 is loosely positioned onto the support portion 240 and the semicircular grooves 244, 264 commonly define the circular channel for loosely receiving the condensing portion 36 of the heat pipe 30 therein. The condensing portion 36 of the heat pipe 30 is rotatable in the channel between the clamping member 260 and the support portion 240; that is, a combination of the base member 200 and the clamping member 260 via the screws 280 can pivot on the condensing portion 36 of the heat pipe 30.

Two fasteners comprising two bolts 190, two nuts 290 and two springs 390 wrapped around the nuts 290, are provided for fastening the first and second heat dissipation units 10, 20 to the top and bottom sides of the printed circuit board 50 respectively. The bolts 190 extend through the bores 129 defined in the base member 120 and the orifices 59 defined in the printed circuit board 50 and the notches 229 defined in the substrate portion 220 and finally threadingly engage with the nuts 290 to have the combined heat dissipation units 10, 20 and heat pipe 30 installed to the printed circuit board 50.

Referring to FIGS. 1-4, after the bolts 190 are securely engaged with the nuts 290, a bottom surface of the base member 120 is engagingly attached on the top surface of the heat-generating component 40. The springs 390 wrapped around the nuts 290 are compressed to press the substrate portion 220 of the base member 200 toward the printed circuit board 50. The screws 180, 280 are then respectively caused to be entirely engaged in the screw holes 126, 246 so that the clamping members 160, 260 intimately and thermally contact the base member 120 and the support portion 240 of the base member 200 respectively. Simultaneously, the evaporating portion 32 of the heat pipe 30 is fittingly received in the channel defined between the clamping member 160 and the base member 120 and thermally connected therewith; the condensing portion 36 of the heat pipe 30 is fittingly received in the channel defined between the clamping member 260 and the support portion 240 of the base member 200 and thermally connected therewith. Therefore, the heat pipe 30 is able to transfer heat from the first heat dissipation unit 10 which is attached on the heat-generating component 40 to the second heat dissipation unit 20 which is separate from the heat-generating component 40. The support portion 240 extends from a level below the printed circuit board 50 to a level above the printed circuit board 50, so that the heat pipe 30 is wholly disposed above the printed circuit board 50 and parallel to the printed circuit board 50.

In the first embodiment of the present invention, the channel between the clamping member 260 and the support portion 240 is perpendicular to the channel between the clamping member 160 and the base member 120; thus, the condensing portion 36 of the heat pipe is designed to be perpendicular to the evaporating portion 32. An extension of the channel between the clamping member 160 and the base member 120 is intersected by the channel between the clamping member 260 and the support portion 240; thus, an L-shaped connecting portion 34 is provided with the heat pipe 30 to interconnect the evaporating portion 32 and the condensing portion 36 of the heat pipe 30.

In the first embodiment of the present invention, the screws 180, 280 render the clamping members 160, 260 adjustable from a state of being loosely positioned to the base members 120, 200 to allow the first and second heat dissipation units 10, 20 rotatable on the heat pipe 30 to a state of intimately and thermally contacting the base members 120, 200 to allow the first and second heat dissipation units 10, 20 fittingly engaged with the heat pipe 30. This design is in favor of assembling the heat dissipation units 10, 20 to the printed circuit board 50 because the heat dissipation units 10, 20 is rotatable on the heat pipe 30 during assembly. The base members 120, 200 and the clamping members 160, 260 are aluminum extruded separately. This is a convenient and cheap way to manufacture the heat dissipation units 10, 20. The heat pipe 30 is wholly disposed at a same side of the printed circuit board 50, i.e., above the printed circuit board 50 as clearly illustrated in FIG. 4.

Figure 5:
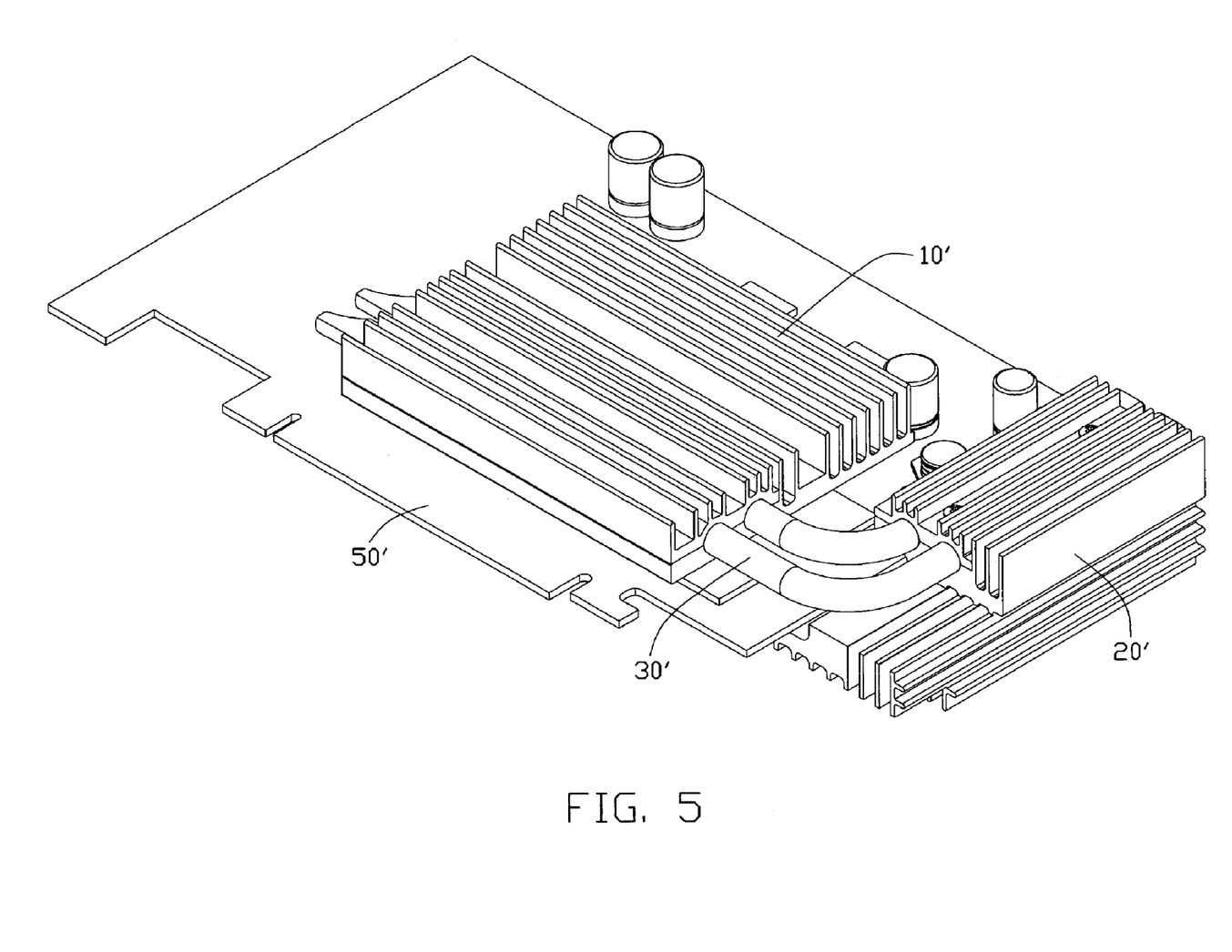
FIG. 5 is an isometric view of a heat dissipation assembly in accordance with a second embodiment of the present invention.
Figure 6:
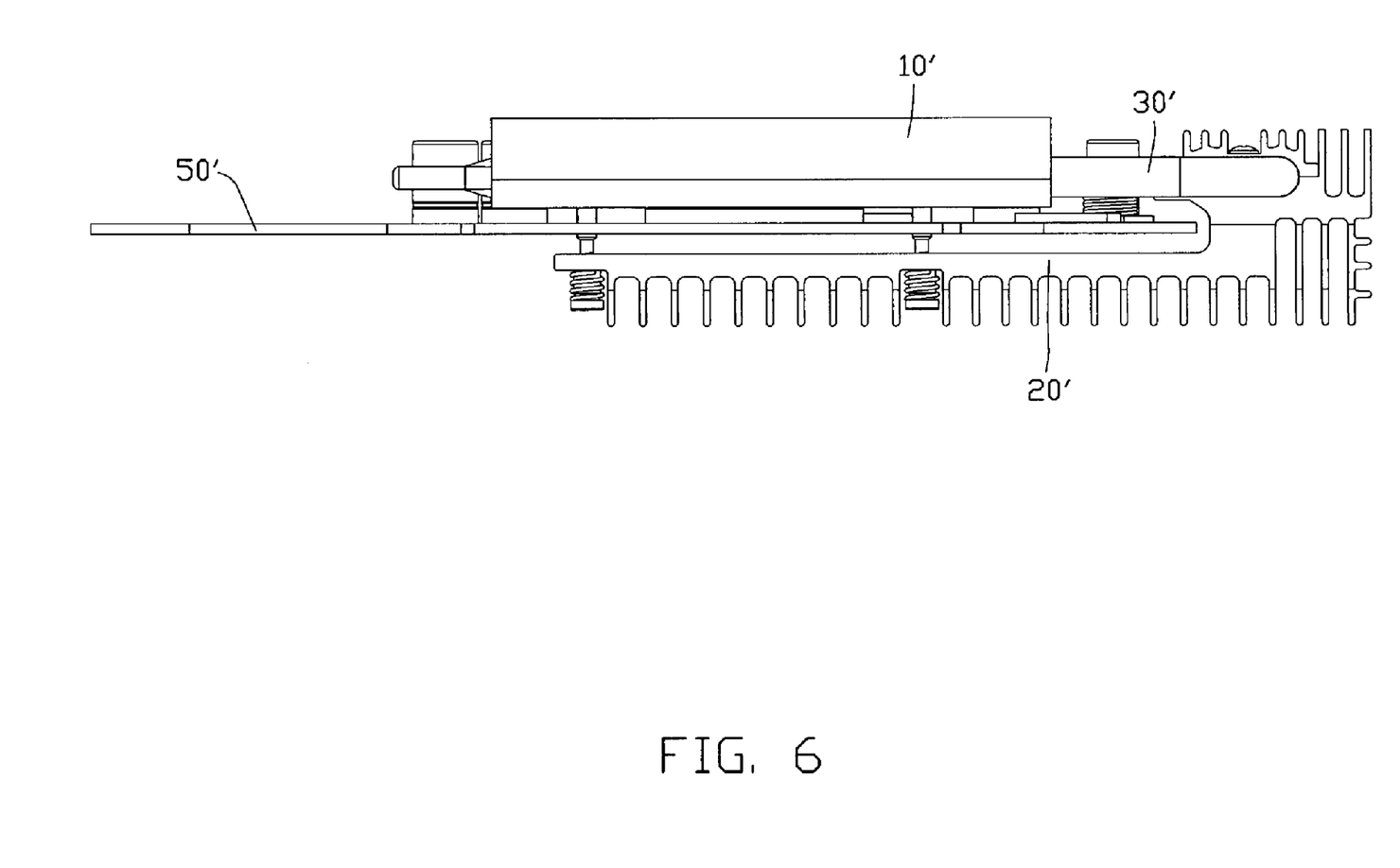
FIG. 6 is an elevation side view of the heat dissipation assembly of FIG. 5.

Referring to FIGS. 5-6, a heat dissipation assembly in accordance with the second embodiment of the present invention comprises a printed circuit board 50' which has a different layout from the printed circuit board 50 of the first embodiment. The heat dissipation assembly comprises first and second heat dissipation units 10', 20' and two heat pipes 30'. Channels (not labeled) defined in the first and second heat dissipation units 10' 20' respectively are perpendicular to each other. The channels of the second heat dissipation unit 20' are so located that they do not intersect with extensions of the channels of the first heat dissipation unit 10'. Accordingly, the heat pipes 30' are designed to be simply L-shaped as seen from a top side of the heat dissipation assembly. Each heat pipe 30' is wholly parallel to the printed circuit board 50' and above the printed circuit board 50'. Furthermore, the heat pipes 30' are parallel to each other. Other features of the heat dissipation assembly in accordance with the second embodiment are similar to those of the first embodiment, so that they can be referenced from the description of the heat dissipation assembly in accordance with the first embodiment.

Figure 7:
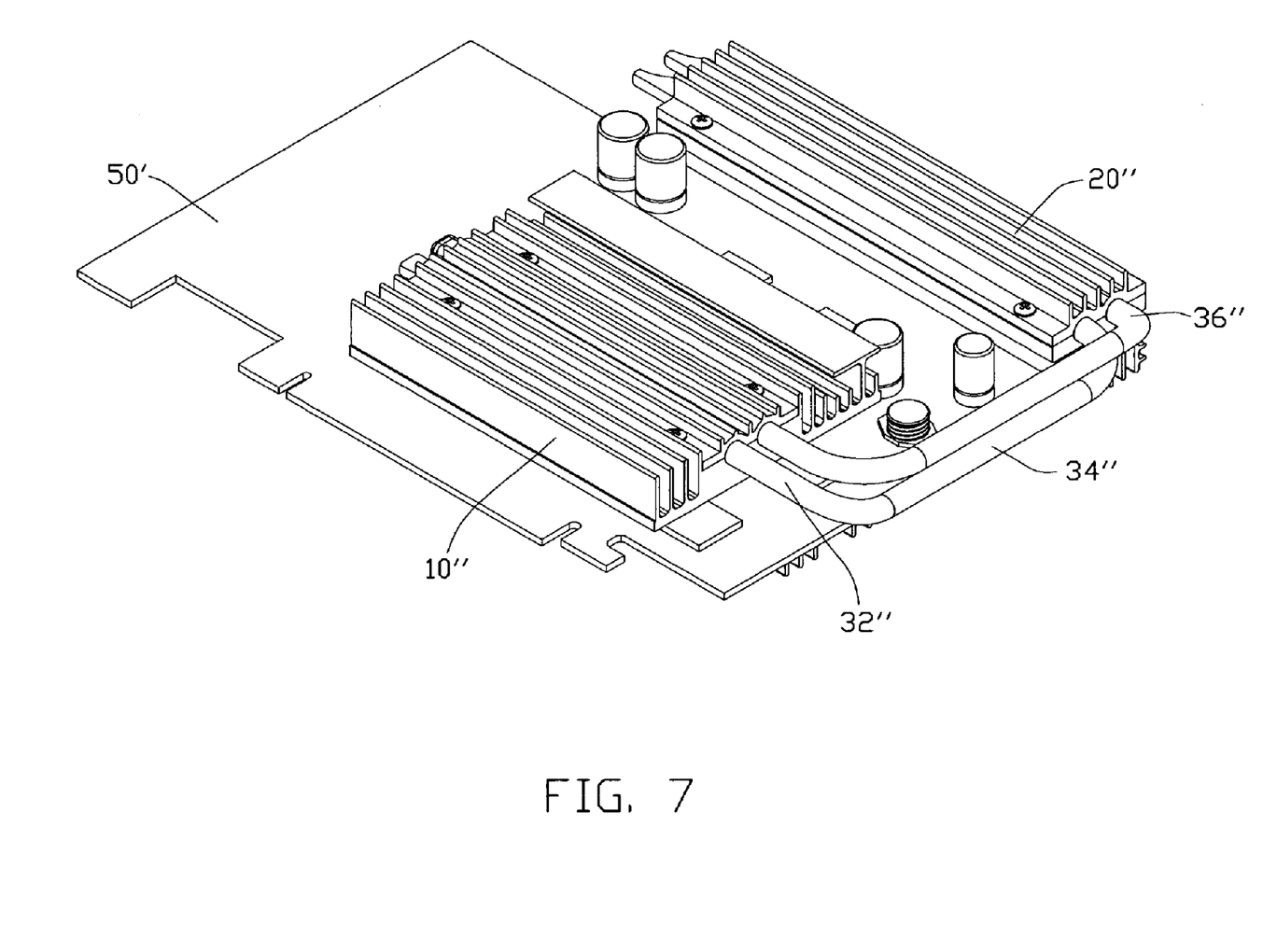
FIG. 7 is an isometric view of a heat dissipation assembly in accordance with a third embodiment of the present invention.
Figure 8:
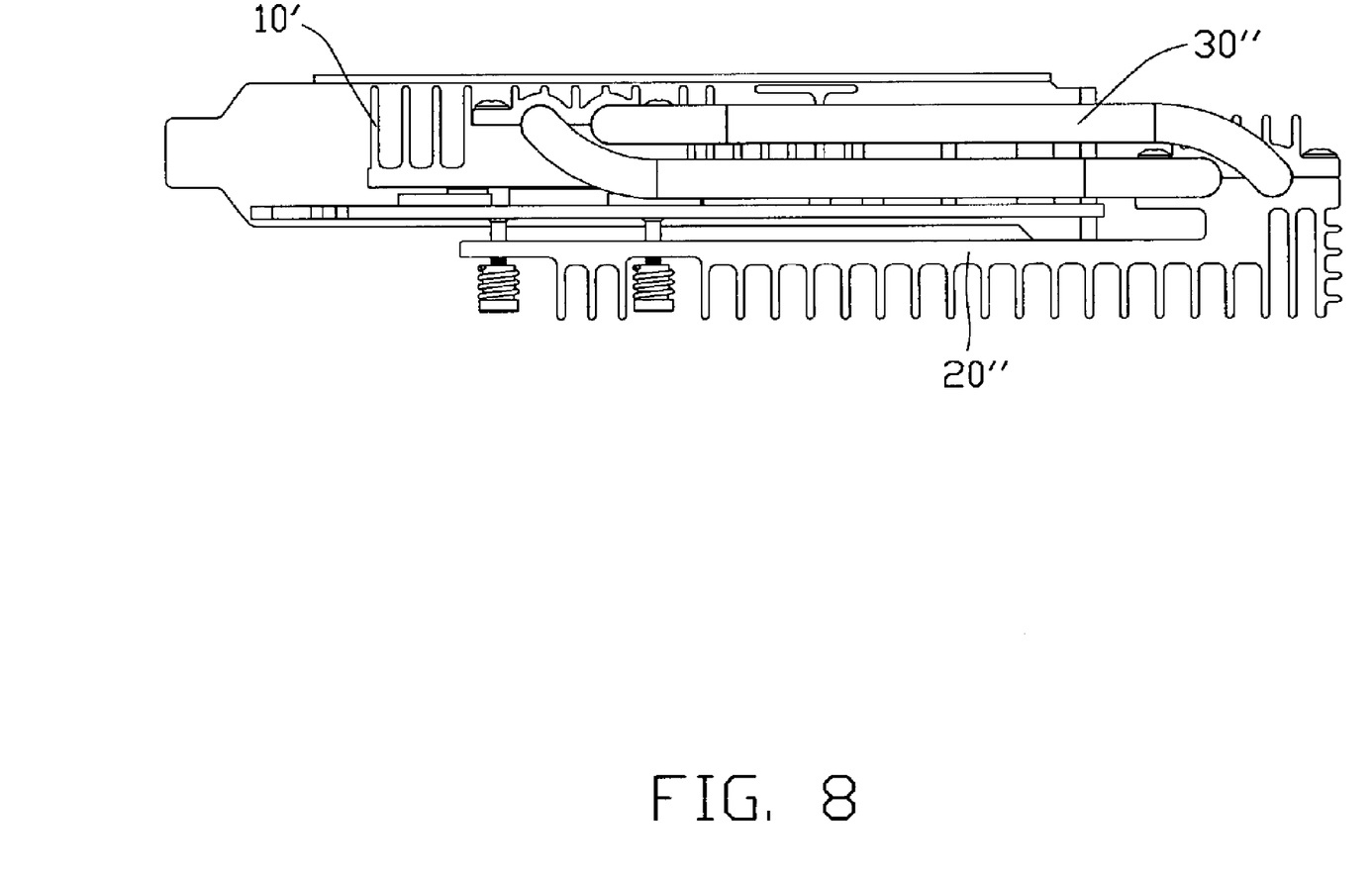
FIG. 8 is a right side view of the heat dissipation assembly of FIG. 7.

Referring to FIGS. 7-8, a heat dissipation assembly in accordance with the third embodiment of the present invention has a printed circuit board the same as the printed circuit board 50' of the second embodiment. The heat dissipation assembly comprises first and second heat dissipation units 10", 20" and two heat pipes 30". Channels (not labeled) defined in the first and second heat dissipation units 10", 20" respectively are parallel to each other. The heat pipes 30" are thus designed to be substantially U-shaped according to the configuration of the first and second heat dissipation units 10", 20", as seen from a top side of the heat dissipation assembly. Each heat pipe 30" is wholly above the printed circuit board 50' and comprises an evaporating portion 32", a connecting portion 34" and a condensing portion 36". The evaporating portions 32" are fittingly received in the channels defined in the first heat dissipation unit 10" at a same level. The connecting portions 34" interconnecting the evaporating portions 32" and the condensing portions 36", are arranged in a manner that one is located above the other. The condensing portions 36" are fittingly received in the channels defined in the second heat dissipation unit 20" at a same level. Other features of the heat dissipation assembly in accordance with the third embodiment are similar to those of the first embodiment and can be referenced from the description of the heat dissipation assembly in accordance with the first embodiment.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation assembly comprising:
   a printed circuit board having an electronic heat-generating component mounted thereon;
   a first heat dissipation unit attached to a top surface of the heat-generating component and defining a channel therein;
   a second heat dissipation unit comprising a main portion disposed beneath the printed circuit board and another portion extending from a level beneath the printed circuit board to another level above the printed circuit board, the second heat dissipation unit defining a channel therein;
   a heat pipe wholly disposed above the printed circuit board and comprising an evaporating portion rotatably received in the channel of the first heat dissipation unit and a condensing portion rotatably received in the channel of the second heat dissipation unit.

2. The heat dissipation assembly as claimed in claim 1, further comprising two fasteners each having a nut and a bolt, the bolts extending through the first heat dissipation unit, the printed circuit board and the second heat dissipation unit and threadingly engaged in the nuts to have the first and second heat dissipation units installed to the printed circuit board.

3. The heat dissipation assembly as claimed in claim 1, wherein the first heat dissipation unit comprises a base member and a clamping member positioned on the base member.

4. The heat dissipation assembly as claimed in claim 3, wherein the base member defines a semicircular groove at a top side thereof, and wherein the clamping member defines a semicircular groove at a bottom side thereof, the semicircular groove of the base member and the semicircular groove of the clamping member commonly defining the channel of the first heat dissipation unit.

5. The heat dissipation assembly as claimed in claim 1, wherein the second heat dissipation unit comprises a base member and a clamping member positioned on the base member.

6. The heat dissipation assembly as claimed in 5, wherein the base member defines a semicircular groove at a top side thereof, and wherein the clamping member defines a semicircular groove at a bottom side thereof, the semicircular groove of the base member and the semicircular groove of the clamping member commonly define the channel of the second heat dissipation unit.

7. The heat dissipation assembly as claimed in claim 1, wherein the channel defined in the first heat dissipation unit is perpendicular to the channel defined in the second heat dissipation unit.

8. The heat dissipation assembly as claimed in claim 1, wherein the heat pipe further comprises an L-shaped connecting portion interconnecting the evaporating portion and the condensing portion.

9. The heat dissipation assembly as claimed in claim 1, wherein the heat pipe is L-shaped.

10. The heat dissipation assembly as claimed in claim 1, wherein the heat pipe is substantially U-shaped.

11. A heat dissipation assembly for dissipating heat of a heat-generating component mounted on a side of a printed circuit board, comprising:
- a heat pipe comprising an evaporating portion and a condensing portion, the heat pipe being adapted for being located on the side of the printed circuit board without extending to other side of the printed circuit board;
- a first heat dissipation unit comprising a base member defining screw holes therein, a clamping member defining through holes therein, and screws extending through the through holes and engagable in the screw holes at first position and second position, at the first position, the clamping member being loosely positioned to the base member to allow the first heat dissipation unit rotatable on the evaporating portion, at the second position, the clamping member securely connecting with the base member to allow the first heat dissipation unit securely engaged and thermally connected with the evaporating portion; and
- a second heat dissipation unit comprising a base member defining screws holes therein, a clamping member defining through holes therein and screws extending through the through holes and engagable in the screw holes of the base member of the second heat dissipation unit at third position and fourth position, at the third position, the clamping member of the second heat dissipation unit being loosely positioned to the base member of the second heat dissipation unit to allow the second heat dissipation unit rotatable on the condensing portion, at the fourth position, the clamping member of the second heat dissipation unit securely connecting with the base member of the second heat dissipation unit to allow the second heat dissipation unit securely engaged and thermally connected with the condensing portion.

12. The heat dissipation assembly as claimed in claim 11, wherein the first heat dissipation unit is adapted to be mounted on the side of the printed circuit board and the base member of the second heat dissipation unit comprises a substrate portion adapted to be mounted on a side of the printed circuit board opposite the side on which the heat-generating component is mounted and a support portion adapted to be extended from the opposite side of the printed circuit board to the side of the printed circuit board on which the heat-generating component is mounted.

13. The heat dissipation assembly as claimed in claim 12, wherein the substrate portion is adapted to be parallel to the printed circuit board and the support portion engages the clamping member of the second heat dissipation unit.

14. An electronic assembly comprising:
- a printed circuit board having a first side on which a heat-generating component is mounted and an opposite second side;
- a heat dissipation assembly having a first heat dissipation unit mounted on the first side of the printed circuit board and thermally connected with the heat-generating component and a second heat dissipation unit mounted on the second side of the printed circuit board, the second heat dissipation unit having a support portion extending from the second side to a place approximate the first side of the printed circuit board; and
- a heat pipe located on the first side of printed circuit board, having an evaporating portion thermally connected with the first heat dissipation unit and a condensing portion thermally connected with the support portion of the second heat dissipation unit; wherein
- the first heat dissipation unit has a base member thermally connecting with the heat-generating component, a first clamping member, and a first screw threadedly connecting the first clamping member and the base member together, the evaporating portion of the heat pipe being sandwiched between the first clamping member and the base member, the second heat dissipation unit has a second clamping member and a second screw threadedly connecting the second clamping member and the support portion together, the condensing portion of the heat pipe being sandwiched between the second clamping member and the support portion.

15. The electronic assembly as claimed in claim 14, wherein the first heat dissipation unit defines a first channel receiving the evaporating portion of the heat pipe and the second heat dissipation unit defines a second channel receiving the condensing portion of the heat pipe, the first channel being oriented perpendicular to the second channel.

16. The electronic assembly of claim 15, wherein the heat pipe has an L-shaped configuration.

17. The electronic assembly of claim 15, wherein the heat pipe has a middle portion interconnecting the evaporating portion and the condensing portion, the middle portion having an L-shaped configuration.

18. The electronic assembly of claim 15, wherein the first heat dissipation unit defines a first channel receiving the evaporating portion of the heat pipe and the second heat dissipation unit defines a second channel receiving the condensing portion of the heat pipe, the first channel being oriented parallel to the second channel.

19. The electronic assembly of claim 18, wherein the heat pipe has a U-shaped configuration.

20. The electronic assembly of claim 19 further comprising a fastener extending through the first heat dissipation unit, the printed circuit and the second heat dissipation unit to connect them together.

* * * * *